(12) United States Patent
Palm et al.

(10) Patent No.: US 10,134,931 B2
(45) Date of Patent: Nov. 20, 2018

(54) LAYER SYSTEM FOR THIN-FILM SOLAR CELLS

(71) Applicant: Saint-Gobain Glass France, Courbevoie (FR)

(72) Inventors: Jörg Palm, München (DE); Stephan Pohlner, München (DE); Thomas Happ, München (DE); Thomas Dalibor, Herrsching am Ammersee (DE); Roland Dietmüller, München (DE)

(73) Assignee: Bengbu Design & Research Institute for Glass Industry, Bengbu (CN)

( * ) Notice: Subject to any disclaimer, the term of this patent is extended or adjusted under 35 U.S.C. 154(b) by 327 days.

(21) Appl. No.: 14/409,653

(22) PCT Filed: Jun. 19, 2013

(86) PCT No.: PCT/EP2013/062726
§ 371 (c)(1),
(2) Date: Dec. 19, 2014

(87) PCT Pub. No.: WO2013/189976
PCT Pub. Date: Dec. 27, 2013

(65) Prior Publication Data
US 2016/0233360 A1    Aug. 11, 2016

(30) Foreign Application Priority Data

Jun. 20, 2012 (EP) .................................... 12172700

(51) Int. Cl.
| | | |
|---|---|---|
| *H01L 31/00* | (2006.01) | |
| *H01L 21/00* | (2006.01) | |
| *H01L 31/0392* | (2006.01) | |
| *H01L 21/02* | (2006.01) | |

(Continued)

(52) U.S. Cl.
CPC .. *H01L 31/03923* (2013.01); *H01L 21/02485* (2013.01); *H01L 21/02557* (2013.01);
(Continued)

(58) Field of Classification Search
CPC ............. H01L 31/03923; H01L 31/186; H01L 31/022475; H01L 31/0323; H01L 31/036; H01L 31/0322; H01L 31/0749; H01L 21/02557; H01L 21/02568; H01L 21/02631; H01L 21/02485; Y02E 10/541
See application file for complete search history.

(56) References Cited

U.S. PATENT DOCUMENTS

| | | | |
|---|---|---|---|
| 2011/0017283 A1* | 1/2011 | Kampmann | .......... C23C 16/305 |
| | | | 136/252 |
| 2011/0048522 A1 | 3/2011 | Chuang | |

FOREIGN PATENT DOCUMENTS

| | | | |
|---|---|---|---|
| EP | 2367208 | 9/2011 | |
| EP | 2367208 A2 * | 9/2011 | ........... H01L 31/032 |

OTHER PUBLICATIONS

Eicke et al., "Chemical characterisation of evaporated In2Sx buffer layers in Cu(In,Ga)Se2 thin-film solar cells with SNMS and SIMS ," Surf. Interface Anal. 2008; 40: 830-833. (Year: 2008).*

(Continued)

*Primary Examiner* — Angelo Trivisonno
(74) *Attorney, Agent, or Firm* — Hodgson Russ LLP

(57) ABSTRACT

The present invention relates to a layer system (1) for thin-film solar cells (100) and solar modules, comprising
an absorber layer (4), which includes a chalcogenide compound semiconductor, and
a buffer layer (5), which is arranged on the absorber layer (4) and includes halogen-enriched $Zn_xIn_{1-x}S_y$ with $0.01 \leq x \leq 0.9$ and $1 \leq y \leq 2$,
wherein the buffer layer (5) consists of a first layer region (5.1) adjoining the absorber layer (4) with a halogen mole fraction $A_1$ and a second layer region (5.2) adjoining the first layer region (5.1) with a halogen mole fraction $A_2$ and the ratio $A_1/A_2$ is $\geq 2$ and the layer thickness ($d_1$) of the first layer region (5.1) is $\leq 50\%$ of the layer thickness (d) of the buffer layer (5).

18 Claims, 12 Drawing Sheets

Figure 1:
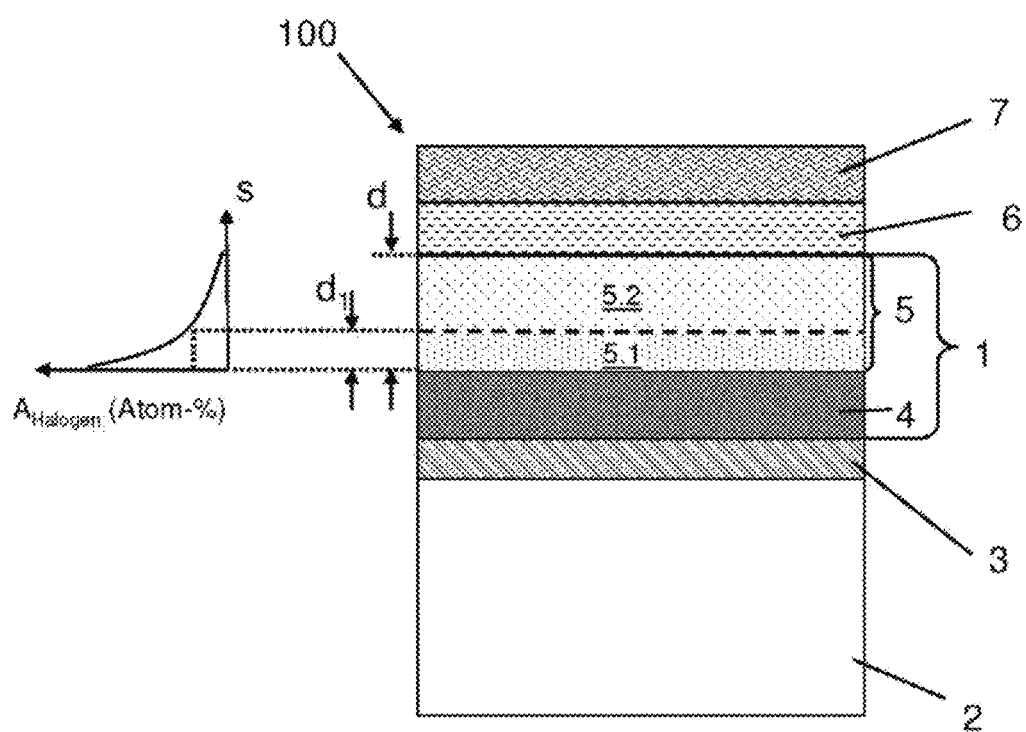

(51) Int. Cl.
　　　H01L 31/032　　　(2006.01)
　　　H01L 31/0749　　(2012.01)
　　　H01L 31/0224　　(2006.01)
　　　H01L 31/036　　　(2006.01)
　　　H01L 31/18　　　(2006.01)

(52) U.S. Cl.
　　　CPC .. H01L 21/02568 (2013.01); H01L 21/02631 (2013.01); H01L 31/022475 (2013.01); H01L 31/036 (2013.01); H01L 31/0322 (2013.01); H01L 31/0323 (2013.01); H01L 31/0749 (2013.01); H01L 31/186 (2013.01); *Y02E 10/541* (2013.01)

(56)　　　　　References Cited

OTHER PUBLICATIONS

Cherian et al., "Role of chlorine on the opto-electronic properties of beta-In2S3 thin films," Thin Solid Films 518 (2010) 1779-1783 (Year: 2010).*

Jost, "The formation of CuInSe2-based thin-film solar cell absorbers from alternative low-cost precursors," Thesis, 2008. (Year: 2008).*

Allsop et al., "Indium sulfide buffer/CIGSSe interface engineering: Improved cell performance by the addition of zinc sulfide," Thin Solid Films 515 (2007) 6068-6072 (Year: 2007).*

Hashimoto et al., (Zn, In)Sx alloy buffer for CuInS2 solar cells, Proceedings of the 3rd World Conference on Photovoltaic Energy Conversion, May 11, 2103, pp. 535-538. May 11, 2003.

Lazzez et al., A Boubaker polynomials expansion scheme (BPES)-related protocol for measuring sprayed thin films thermal characteristics, Current Applied Physics, vol. 9, No. 5, Jan. 2009, pp. 1129-1133. Jan. 9, 2009.

Li et al., Preparation and characterization of ZnIn2S4 thin films deposited by spray pyrolysis for hydrogen production, International Journal of Hydrogen Energy, vol. 33, No. 12, May 27, 2008, pp. 2891-2896. May 27, 2008.

\* cited by examiner

LAYER SYSTEM FOR THIN-FILM SOLAR CELLS

The present invention relates to a layer system for thin-film solar cells and a method for producing the layer system.

Thin-film systems for solar cells and solar modules are sufficiently known and available on the market in various designs depending on the substrate and the materials applied thereon. The materials are selected such that the incident solar spectrum is utilized to the maximum. Due to the physical properties and the technological handling qualities, thin-film systems with amorphous, micromorphous, or polycrystalline silicon, cadmium telluride (CdTe), gallium arsenide (GaAs), copper indium (gallium) selenide sulfide ($Cu(In,Ga)(S,Se)_2$), and copper zinc tin sulfo-selenide (CZTS from the group of the kesterites) as well as organic semiconductors are particularly suited for solar cells. The pentenary semiconductor $Cu(In,Ga)(S,Se)_2$ belongs to the group of chalcopyrite semiconductors that are frequently referred to as CIS (copper indium diselenide or copper indium disulfide) or CIGS (copper indium gallium diselenide, copper indium gallium disulfide, or copper indium gallium disulfoselenide). In the abbreviation CIGS, S can represent selenium, sulfur, or a mixture of the two chalcogens.

Current thin-film solar cells and solar modules based on $Cu(In,Ga)(S,Se)_2$ require a buffer layer between a p-conductive $Cu(In,Ga)(S,Se)_2$ absorber and an n-conductive front electrode that usually comprises zinc oxide (ZnO). According to current knowledge, this buffer layer enables electronic adaptation between the absorber material and the front electrode. Moreover, it offers protection against sputtering damage in the subsequent process step of deposition of the front electrode by DC-magnetron sputtering. Additionally, by constructing a high-ohm intermediate layer between p- and n-semiconductors, it prevents current drain from electrically good zones into poor zones.

To date, cadmium sulfide (CdS) has been most frequently used as a buffer layer. To be able to produce good efficiency of the cells, CdS has, to date, been deposited in a chemical bath process (CBD process), a wet chemical process. However, associated with this is the disadvantage that the wet chemical process does not fit well into the process cycle of the current production of $Cu(In,Ga)(S,Se)_2$ thin-film solar cells.

A further disadvantage of the CdS-buffer layer consists in that it includes the toxic heavy metal cadmium. This creates higher production costs since increased safety precautions must be taken in the production process, e.g., in the disposal of wastewater. Moreover, additional costs arise at the time of disposal of the product after expiration of the service life of the solar cell.

Consequently, various alternatives to the buffer made of CdS have been tested for different absorbers from the family of the $Cu(In,Ga)(S,Se)_2$ semiconductors, e.g., sputtered ZnMgO, Zn(S,OH) deposited by CBD, In(O,OH) deposited by CBD, and indium sulfide deposited by ALD (atomic layer deposition), ILGAR (ion layer gas deposition), spray pyrolysis, or PVD (physical vapor deposition) processes, such as thermal deposition or sputtering.

However, these materials still are not suitable as buffers for solar cells based on $Cu(In,Ga)(S,Se)_2$ for commercial use, since they do not achieve the same efficiencies (ratio of incident power to the electrical power produced by a solar cell) as those with a CdS buffer layer. The efficiencies for such modules are roughly up to about 20% for lab cells on small surfaces and between 10% and 12% for large-area modules. Moreover, they present excessive instabilities, hysteresis effects, or degradations in efficiency when they are exposed to light, heat, and/or moisture.

A further disadvantage of CdS is based on the fact that CdS is a direct semiconductor with a direct electronic band gap of roughly 2.4 eV. Consequently, in a $Cu(In,Ga)(S,Se)_2/CdS/ZnO$ solar cell, already with CdS-film thicknesses of a few 10 nm, the incident light is mostly absorbed. The light absorbed in the buffer layer is lost for the electrical yield since the charge carriers generated in this layer recombine right away since there are many crystal defects in this region of heterojunction and in the buffer material acting as recombination centers. Thus, the light absorbed in the buffer layer is lost for the electrical yield. As a result, the efficiency of the solar cell is reduced, which is disadvantageous for a thin-film cell.

A layer system with a buffer layer based on indium sulfide is, for example, known from WO2009141132 A2. The layer system comprises a chalcopyrite absorber of the CIS family, in particular $Cu(In,Ga)(S,Se)_2$ in conjunction with a buffer layer of indium sulfide. The indium sulfide ($In_vS_w$) buffer layer has, for example, a slightly indium-rich composition with v/(v+w)=41% to 43% and can be deposited with various non-wet chemical methods, for example, by thermal deposition, ion layer gas reaction, cathode sputtering (sputtering), atomic layer deposition (ALD), or spray pyrolysis.

However, in the development to date of this layer system and of the production method, it has been demonstrated that the efficiency of solar cells with an indium sulfide buffer layer is lower than that with CdS buffer layers.

Consequently, the object of the present invention is to provide a layer system based on a compound semiconductor with a buffer layer that has a high level of efficiency and high stability, with production that is economical and environmentally safe.

This object is accomplished according to the invention by a layer system according to claim 1. Advantageous improvements of the invention emerge from the subclaims.

The invention further includes a method for producing a layer system for thin-film solar cells.

A use of the layer system according to the invention is presented in further claims.

The layer system according to the invention for thin-film solar cells comprises at least
- an absorber layer, which includes a chalcogenide compound semiconductor, and
- a buffer layer, which is arranged on the absorber layer and includes halogen-enriched $Zn_xIn_{1-x}S_y$, with $0.01 \leq x \leq 0.9$, $1 \leq y \leq 2$, wherein the buffer layer consists of a first layer region adjoining the absorber layer with a halogen mole fraction $A_1$ and a second layer region adjoining the first layer region with a halogen mole fraction $A_2$ and the ratio $A_1/A_2$ is $\geq 2$.

Since the elements of the buffer layer can, in each case, be present in different oxidation states, all oxidation states are referred to in the following with the name of the element unless explicitly indicated otherwise. Consequently, the term sodium, for example, means elemental sodium and sodium ions as well as sodium in compounds. Moreover, the term halogen means elemental halogen and halide as well as halogen in compounds.

In an advantageous embodiment of the layer system according to the invention, the layer thickness $d_1$ of the first layer region is $\leq 50\%$ of the layer thickness d the total buffer layer. The layer thickness d of the buffer layer is the sum of the layer thicknesses of the first layer region and of the second layer region. In a preferred embodiment, the layer thickness $d_1$ of the first layer region is ≤30% and particularly preferably ≤20% of the layer thickness d of the buffer layer. In another advantageous embodiment of the invention, the layer thickness $d_1$ of the first layer region is 30% and particularly preferably 20% of the layer thickness d of the buffer layer.

The present invention is based on the following finding of the inventors that enrichment of a halogen in the buffer layer at the interface with the absorber layer increases the open circuit voltage and, thus, the efficiency of a solar cell according to the invention. This can be explained by the fact that the halogen enrichment through the relatively large halogen atoms or halogen ions localized at the interface forms a diffusion barrier against the inward diffusion of impurities such as copper out of the absorber layer into the buffer layer. The halogen atoms can also have a positive effect both on the electronic band adaptation at the absorber-buffer heterojunction and on the recombination of the charge carriers at this interface. In order not to degrade the electronic properties of the buffer layer, the halogen enrichment should be limited in a narrow layer region of the buffer layer at the interface with the absorber layer.

A delta-peak-shaped halogen enrichment at the interface the absorber layer would, in principle, be adequate to obtain an improvement of the efficiency. However, because of the surface roughness of the absorber layer, a delta-peak-shaped halogen enrichment is neither producible nor verifiable by existing measurement methods. Fixing the layer thickness $d_1$ in the above-mentioned range has, consequently, proved particularly advantageous. A particularly economical method for introduction of the halogen that results in the halogen enrichment claimed has also been developed.

At the same time, the short-circuit current strength is increased by a mole fraction of zinc in the buffer layer according to the invention. Through the combination of the two effects, particularly advantageous layer systems can be obtained. For this, the buffer layer according to the invention contains $Zn_xIn_{1-x}S_y$ with 0.01≤x≤0.9 and 1≤y≤2.

In an advantageous embodiment of the invention, y is from x+(1−x)*1.3 to x+(1−x)*1.5. When the $Zn_xIn_{1-x}S_y$ buffer layer is deposited by deposition of $In_2S_3$ and ZnS or other methods with precursors made of $In_2S_3$ and ZnS, the following is true: y=x+(1−x)*1.5. If, for example, ZnS and $In_2S_3$ are deposited in the molar ratio 2:1, x=0.5 and y=1.25. The buffer layer then contains $Zn_{0.5}In_{0.5}S_{1.25}$. If a fraction of the sulfur is held back, for example, by deposition of $In_2S_{2.8}$ or gettering of the sulfur out of the vapor area, relatively small sulfur levels of, for example, y=x+(1−x)*1.4 or y=x+(1−x)*1.3 can be obtained.

The sulfur content y can be even smaller with vapor deposition but also with other depositions out of the precursors ZnS and $In_2S_3$, for example, by a method according to DE 10 2008 008 518 A1. However, since the band gap decreases with increasing indium content, the sulfur content should not be less than y=1, which corresponds to a compound of ZnS and InS. The sulfur content y can be even greater than y=x+(1−x)*1.5 through the exposure of the evaporator sources in a sulfur-containing atmosphere.

In another advantageous embodiment of a layer system according to the invention, the ratio of the halogen mole fractions $A_1/A_2$ is from 2 to 1000, preferably from 9 to 1000, and particularly preferably from 10 to 100. In this range, particularly good efficiencies can be obtained.

In an advantageous embodiment of the invention, the chalcogenide compound semiconductor contains Cu(In,Ga,Al)(S,Se)$_2$ and preferably CuInSe$_2$, CuInS$_2$, Cu(In,Ga)Se$_2$ or Cu(In,Ga)(S,Se)$_2$, or Cu$_2$ZnSn(S,Se)$_4$. In another advantageous embodiment of the layer system according to the invention, the absorber layer consists substantially of the chalcogenide compound semiconductor Cu$_2$ZnSn(S,Se)$_4$ or Cu(In,Ga,Al)(S,Se)$_2$ and preferably of CuInSe$_2$, CuInS$_2$, Cu(In,Ga)Se$_2$ or Cu(In,Ga)(S,Se)$_2$. In particular, the absorber layer includes Cu(In,Ga)(S,Se)$_2$ with a ratio of the mole fractions of [S]/([Se]+[S]) on the surface of the absorber layer between 10% and 90%, in particular 20% to 65%, and preferably 35%, by means of which the sulfur is incorporated into the anion lattice of the chalcopyrite structure. By this means, a fine tuning of the band gap and the band adaptation compared to the indium sulfide of the buffer layer can be achieved and particularly high efficiencies can thus be obtained.

The enrichment of the buffer layer takes place by means of a halogen, a halide, or a halogen compound. The halogen is preferably chlorine, bromine, or iodine. The enrichment takes place preferably by means of deposition of one or a plurality of metal-halide compounds of the group metal-chloride, metal-bromide, or metal-iodide. The use of metal-fluoride compounds is also possible, whereby these diffuse very readily out of the enrichment zone due to their low mass and their small atomic radius.

The metal of the metal-halide compound is advantageously an alkali metal, preferably sodium or potassium, an element from the group IIIa, preferably indium or a transition element of the group IIb, preferably zinc. Preferred metal-halide compounds are, accordingly, sodium chloride, zinc chloride, indium chloride, sodium bromide, potassium chloride, and potassium bromide.

Sodium is present in chalcogenide absorber layers either through diffusion from the soda lime glass substrate or by selective addition. The enrichment of alkali metals and, in particular, sodium at the interface can be another advantage of the use of sodium chloride. Sodium thus suppresses the inward diffusion of copper into the indium sulfide buffer layer, which would reduce the band gap in the buffer layer.

In addition to the sodium and potassium compounds, the use of zinc-halide compounds, in particular of zinc chloride or indium-halide compounds, in particular of indium chloride is particularly advantageous, since zinc and indium are components of the buffer layer and thus no foreign metal is introduced into the layer structure according to the invention.

As experiments of the inventors demonstrated, higher concentrations of oxygen or hydrogen are undesirable as they negatively affect moisture stability. In a first layer region according to the invention, the local mole fraction of the halogen is preferably at least double the local mole fraction of oxygen and/or carbon. In this context, "local" means at any point of the first layer region in a measurement volume obtainable with a measurement method.

In an advantageous embodiment of a layer system according to the invention, the amount of the halogen in the first layer region corresponds to an area concentration of $1 \cdot 10^{13}$ atoms/cm$^2$ to $1 \cdot 10^{17}$ atoms/cm$^2$ and preferably of $2 \cdot 10^{14}$ atoms/cm$^2$ to $2 \cdot 10^{16}$ atoms/cm$^2$. Here, as well, the expression "amount" includes the amount of the halogen atoms and ions of the halogen element of all oxidation states present. For an area concentration in the range indicated above, particularly high efficiencies were measured.

In another advantageous embodiment of a layer system according to the invention, the halogen mole fraction in the buffer layer has a gradient that decreases from the surface facing the absorber layer to the interior of the buffer layer. Through the continuous decrease in the halogen fraction, a particularly advantageous transition between the band structures of the first and second layer regions of the buffer layer develops.

The layer thickness d of a buffer layer according to the invention is preferably from 5 nm to 150 nm and particularly preferably from 15 nm to 50 nm. Particularly high efficiencies were obtained for such layer thicknesses.

In an advantageous embodiment of the layer system according to the invention, only the local mole fractions of indium, sulfur, sodium, zinc, and the metal of the metal-halide compound are greater than the local mole fraction of the halogen. Preferably, the buffer layer contains no impurities, in other words, it is not intentionally provided with other elements, such as oxygen or carbon, and includes these, at most, within the limits of concentrations of less than or equal to 5 Mol % unavoidable from a production technology standpoint. This makes it possible to guarantee high efficiency.

Another aspect of the invention comprises solar cells and, in particular, thin-film solar cells with the layer system according to the invention and solar cell modules that include these solar cells.

A solar cell according to the invention comprises at least:
a substrate,
a rear electrode that is arranged on the substrate,
a layer system according to the invention that is arranged on the rear electrode, and
a front electrode that is arranged on the second buffer layer.

The substrate is preferably a metal, glass, plastic, or ceramic substrate, with glass being preferable. However, other transparent carrier materials, in particular plastics can be used.

The rear electrode advantageously includes molybdenum (Mo) or other metals. In an advantageous embodiment of the rear electrode, it has a molybdenum sublayer adjoining the absorber layer and a silicon nitride sublayer (SiN) adjoining the molybdenum sublayer. Such rear electrodes are known, for example, from EP 1356528 A1.

The solar cell according to the invention advantageously includes a front electrode made of a transparent conductive oxide (TCO), preferably indium tin oxide (ITO) and/or zinc oxide (ZnO), with doped ZnO, in particular Al- or Ga-doped ZnO particularly preferable.

In an advantageous embodiment of a solar cell according to the invention, a second buffer layer is arranged between the layer system and the front electrode. The second buffer layer preferably includes non-doped zinc oxide and/or non-doped zinc magnesium oxide.

The solar cells produced with this layer system have high efficiencies with, at the same time, high long-term stability. Since toxic substances are no longer used, the production method is more environmentally safe and less expensive and there are also no follow-up costs, as with CdS buffer layers.

The invention further includes a method for producing a layer system according to the invention, wherein at least
a) an absorber layer (4) is prepared, and
b) a buffer layer (5), which contains halogen-enriched $Zn_xIn_{1-x}S_y$ with $0.01 \leq x \leq 0.9$ and $1 \leq y \leq 2$, is arranged on the absorber layer (4), wherein the buffer layer (5) consists of a first layer region (5.1) adjoining the absorber layer (4) with a halogen mole fraction $A_1$ and a second layer region (5.2) adjoining the first layer region (5.1) with a halogen mole fraction $A_2$ and the ratio $A_1/A_2$ is $\geq 2$.

Expediently, the absorber layer is applied in an RTP ("rapid thermal processing") process on the rear electrode on a substrate. For $Cu(In,Ga)(S,Se)_2$ absorber layers, a precursor layer is first deposited on the substrate with the rear electrode. The precursor layer includes the elements copper, indium, and gallium, which are applied by sputtering. At the time of the coating with the precursor layers, a specific sodium dose is introduced into the precursor layers, as is known, for example, from EP 715 358 B1. In addition, the precursor layer contains elemental selenium that is applied by thermal deposition. During these processes, the substrate temperature is below 100° C. such that the elements substantially remain unreacted as metal alloys and elemental selenium. Then, this precursor layer is reacted by rapid thermal processing (RTP) in a sulfur-containing atmosphere to form a $Cu(In,Ga)(S,Se)_2$ chalcopyrite semiconductor.

In principle, for the production of the buffer layer, all chemical-physical deposition methods in which the molar ratio of halogen or halide to zinc indium sulfide as well as the ratio of zinc to indium and indium to sulfur can be controlled in the desired range are suitable.

The buffer layer according to the invention is advantageously applied on the absorber layer by atomic layer deposition (ALD), ion layer gas deposition (ILGAR), spray pyrolysis, chemical vapor deposition (CVD), or physical vapor deposition (PVD). The buffer layer according to the invention is preferably deposited by sputtering, thermal deposition, or electron beam deposition, particularly preferably from separate sources for the halogen and indium sulfide and zinc sulfide. Indium sulfide can be evaporated either from separate sources for indium and sulfur or from one source with an $In_2S_3$ compound semiconductor material. Other indium sulfides ($In_5S_6/S_7$ or InS) are also possible in combination with a sulfur source.

The halogen is preferably introduced from a metal-halogen compound and particularly preferably from a metal-halide compound. Particularly suitable metal halide compounds are sodium chloride, sodium bromide, potassium chloride, potassium bromide, zinc chloride, and/or indium chloride. These metal-halide compounds are particularly advantageous since they have only slight toxicity, good processability, and simple integratability into existing technical processes. The halogen element chlorine is preferred since the greatest increases in efficiency were evidenced in the experiment.

For the deposition of a metal-halide compound and, in particular, of sodium chloride, potassium chloride, indium chloride, and zinc chloride before the coating with zinc indium sulfide, both wet-chemical and dry processes based on vacuum technology can be used.

In particular, dip coating, spraying, aerosol spraying, pouring, immersion, or washing the absorber with a metal-halide-containing solution (for example, with water as solvent) can be used as wet-chemical methods for deposition of a metal-halide compound. The drying of the absorber layer after deposition can take place either at room temperature or at elevated temperatures. If need be, the drying can be assisted by blowing with gaseous nitrogen using a so-called air knife such that a homogeneous metal-halide layer develops on the absorber.

The ion layer gas deposition (ILGAR) method is also suitable if the halogen gradients and the zinc content are adjusted with suitable precursors.

The buffer layer according to the invention is advantageously deposited with a vacuum method. The vacuum method has the particular advantage that, under a vacuum, the incorporation of oxygen or hydroxide is prevented. Hydroxide components in the buffer layer are believed to be responsible for transients in efficiency under the effect of heat and light. Moreover, the vacuum methods have the advantage that the method does without wet chemistry and standard vacuum coating equipment can be used.

A further advantage of the vacuum process consists in that a higher material yield can be obtained. Moreover, in contrast to wet deposition, vacuum processes are more environmentally safe since, for example, in contrast to chemical bath deposition, no contaminated wastewater is generated. In addition, different vacuum processes, such as even the production of the second non-doped ZnO buffer layer or the doped ZnO front electrode can be linked in one system, by means of which production can be more economical. Depending on the design of the process for production of the absorber layer, even a combination of the production of the absorber layer and the buffer layer without interim exposure to air is conceivable.

Thermal deposition under a vacuum has the advantage that the method does without wet chemistry and standard vacuum coating equipment can be used. During thermal deposition, the metal-halogen compound is applied directly on the absorber layer in a vacuum environment and the absorber layer with the metal-halogen layer can then be vaporized with zinc indium sulfide without interrupting the vacuum.

In a particularly advantageous embodiment of the method according to the invention, the metal-halogen compound is evaporated from one source and zinc indium sulfide from two other separate sources, one indium sulfide source and one zinc sulfide source.

The arrangement of the deposition sources is implemented such that the steam beams of the sources overlap completely, partially, or not at all. "Steam beam" in the context of the present application means the region in front of the outlet of the source that is technically suitable for the deposition of the evaporated material on a substrate in terms of deposition rate and homogeneity.

The halogen source, the indium sulfide source, and/or the zinc sulfide source are, for example, effusion cells, out of which a metal-halogen compound such as sodium chloride, zinc chloride, or indium chloride or indium sulfide and zinc sulfide is thermally evaporated. Alternatively, any other form of generation of steam beams is suitable for the deposition of the buffer layer, so long as the ratio of the mole fractions of chlorine, zinc, indium, and sulfur can be controlled. Alternative sources are, for example, boats of linear evaporators or crucibles of electron beam evaporators.

In an exemplary embodiment of the method according to the invention, the absorber layer is conveyed past steam beams of sodium chloride and steam beams of indium sulfide and zinc sulfide in an in-line method. The steam beams overlap completely, partially, or not at all. In addition, the deposition rate of the individual sources can be controlled by apertures or by the temperature. A halogen gradient can thus be adjusted by the evaporation geometry and the adjustment of the rates alone.

In an alternative embodiment of the method according to the invention, in the second step b) a metal-halide compound is first deposited on the absorber layer. For example, sodium chloride is evaporated out of an effusion cell. The amount of sodium chloride evaporated is controlled by opening and closing an aperture or by temperature control. Then, in a further step, a buffer layer of zinc indium sulfide is deposited, preferably without vacuum interruption, on the absorber layer coated with sodium chloride.

In an alternative embodiment of the in-line method according to the invention for producing a buffer layer according to the invention, one halogen source, one indium sulfide source, and one zinc sulfide source are arranged one after another such that the steam beams of the indium sulfide source and of the zinc sulfide source overlap virtually completely. This mixed steam beam formed thereby overlaps at least partially with the steam beam of the halogen source, preferably from 10% to 70% and particularly preferably from 25% to 50%. In this manner, a gradient with a continuous decrease in the halogen concentration can be formed in the buffer layer, which is particularly advantageous for the properties of the solar cell according to the invention.

A further aspect of the invention comprises a device for production of a buffer layer according to the invention in an in-line method, wherein at least one halogen source, at least one indium sulfide source, and at least one zinc sulfide source are arranged one after another such that the steam beam of the halogen source and the mixed steam beam of indium sulfide and zinc sulfide overlap at least partially, preferably from 10% to 70% and particularly preferably from 25% to 50%.

Figure 2:
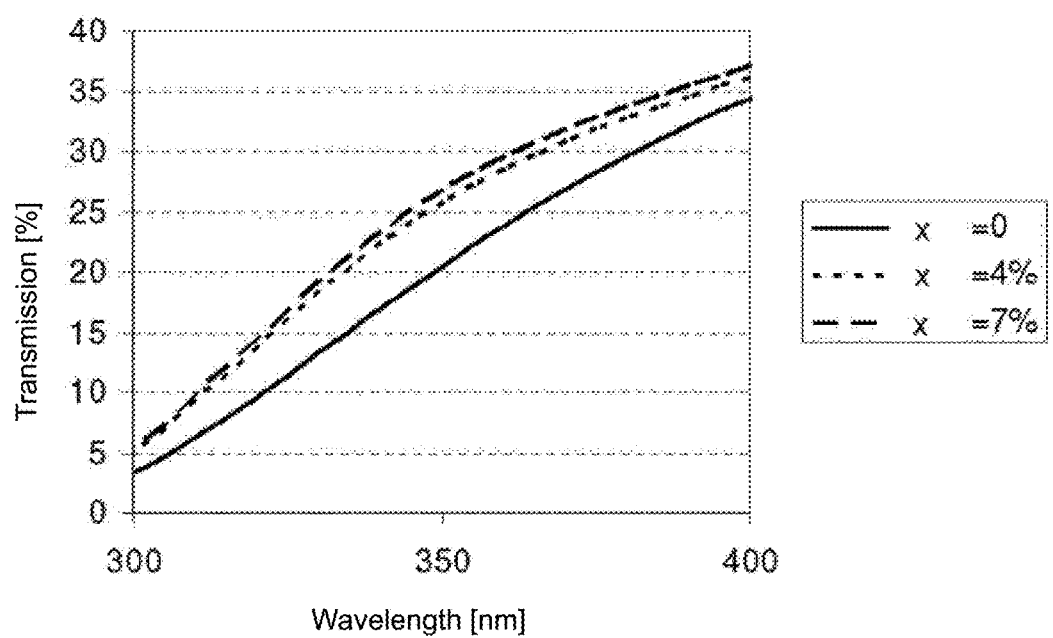
Figure 3:
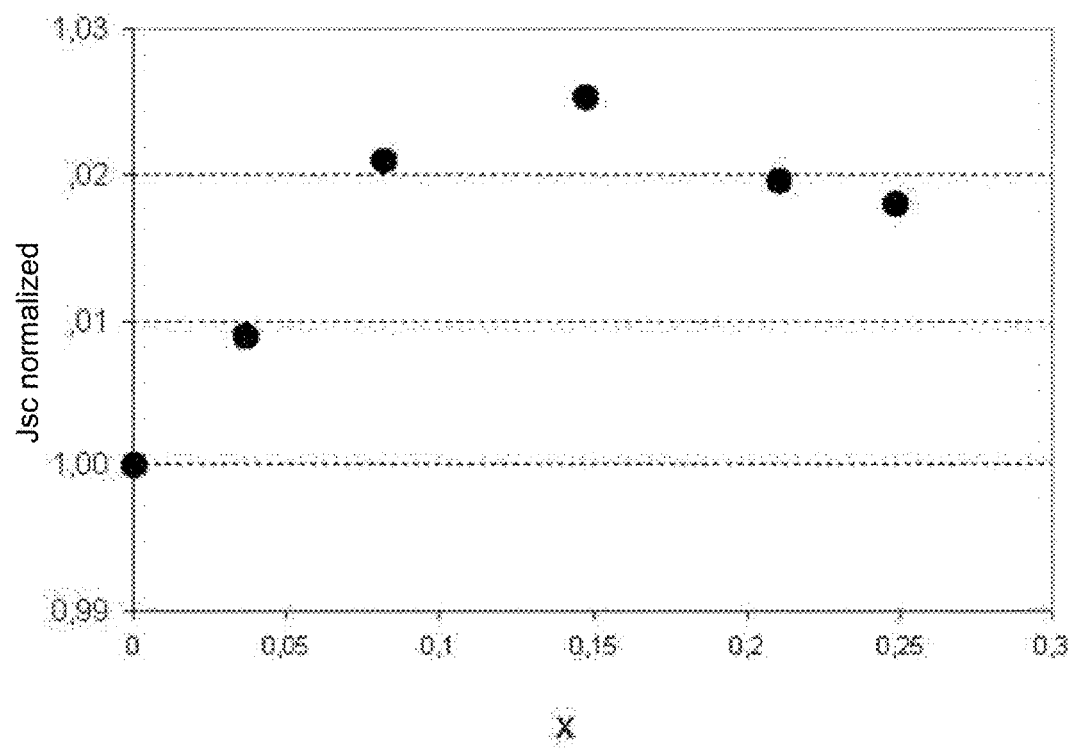
Figure 4:
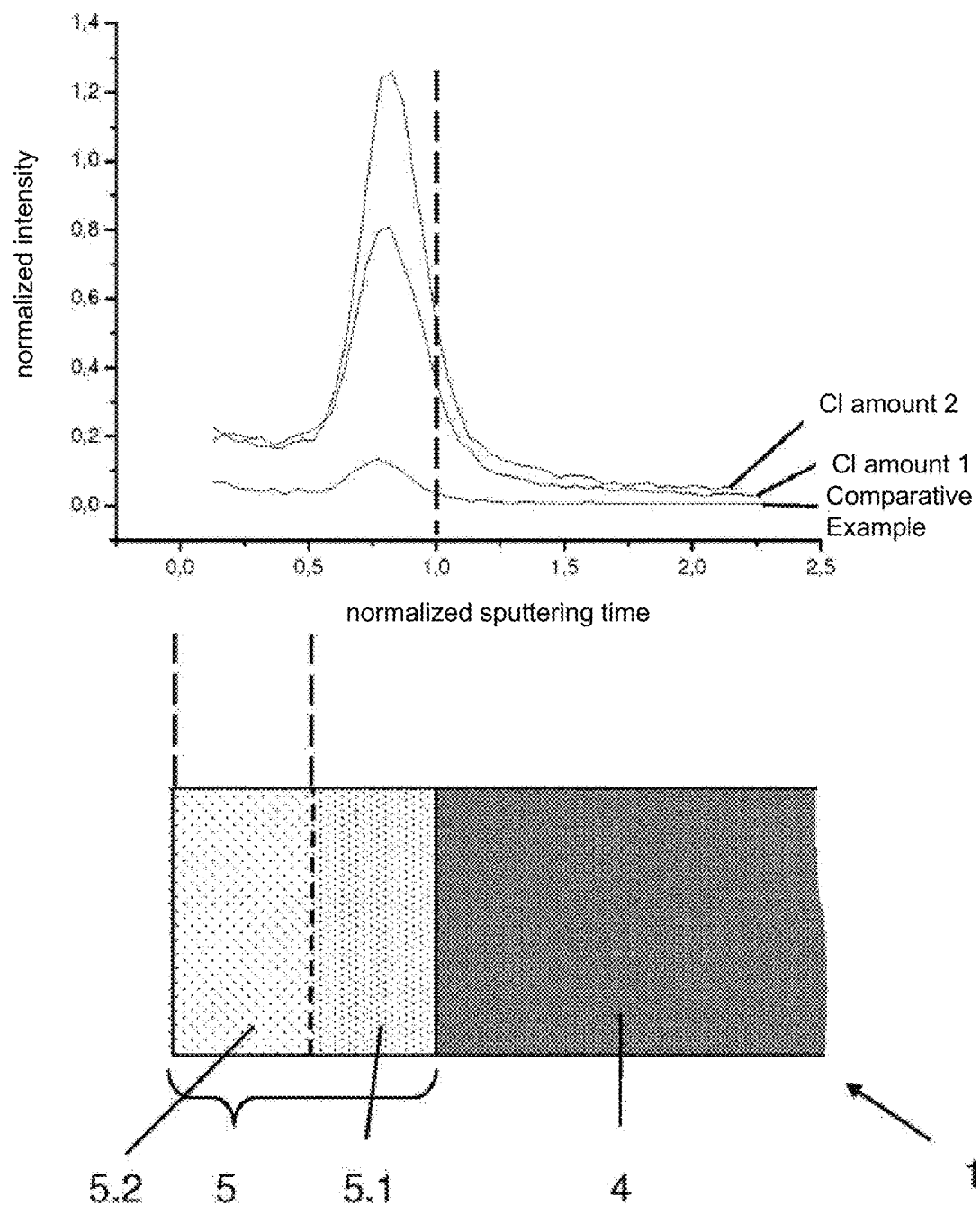
Figure 5:
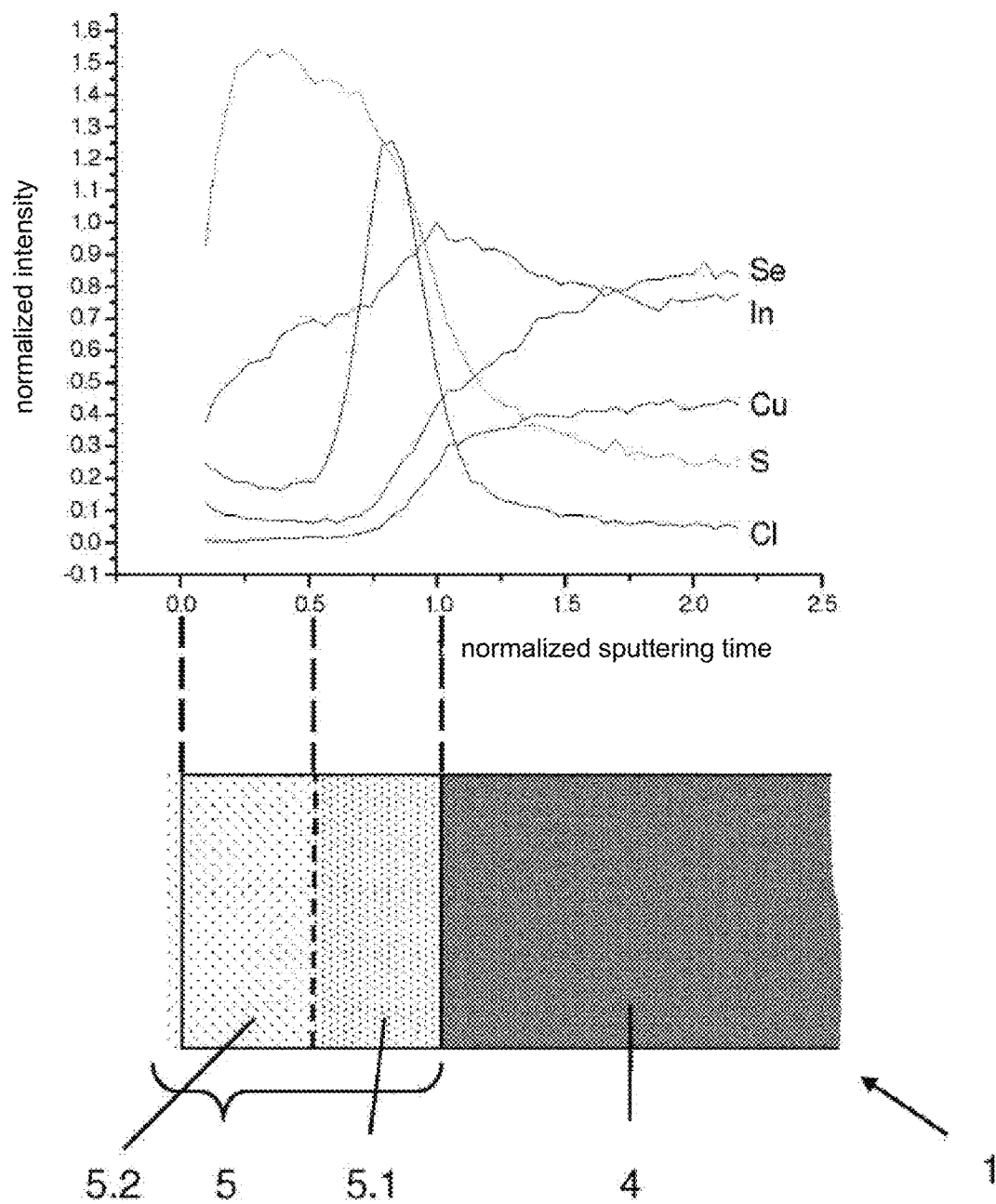
Figure 6:
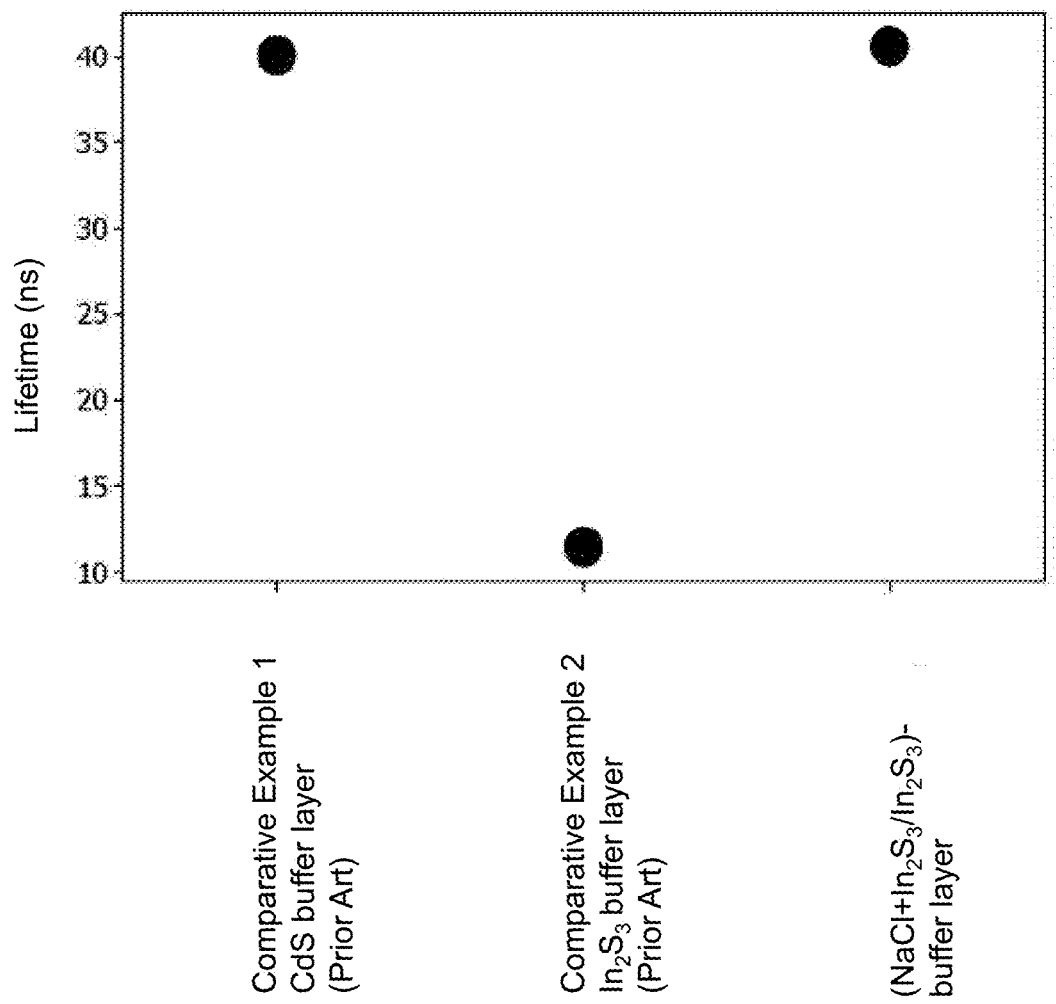
Figure 7:
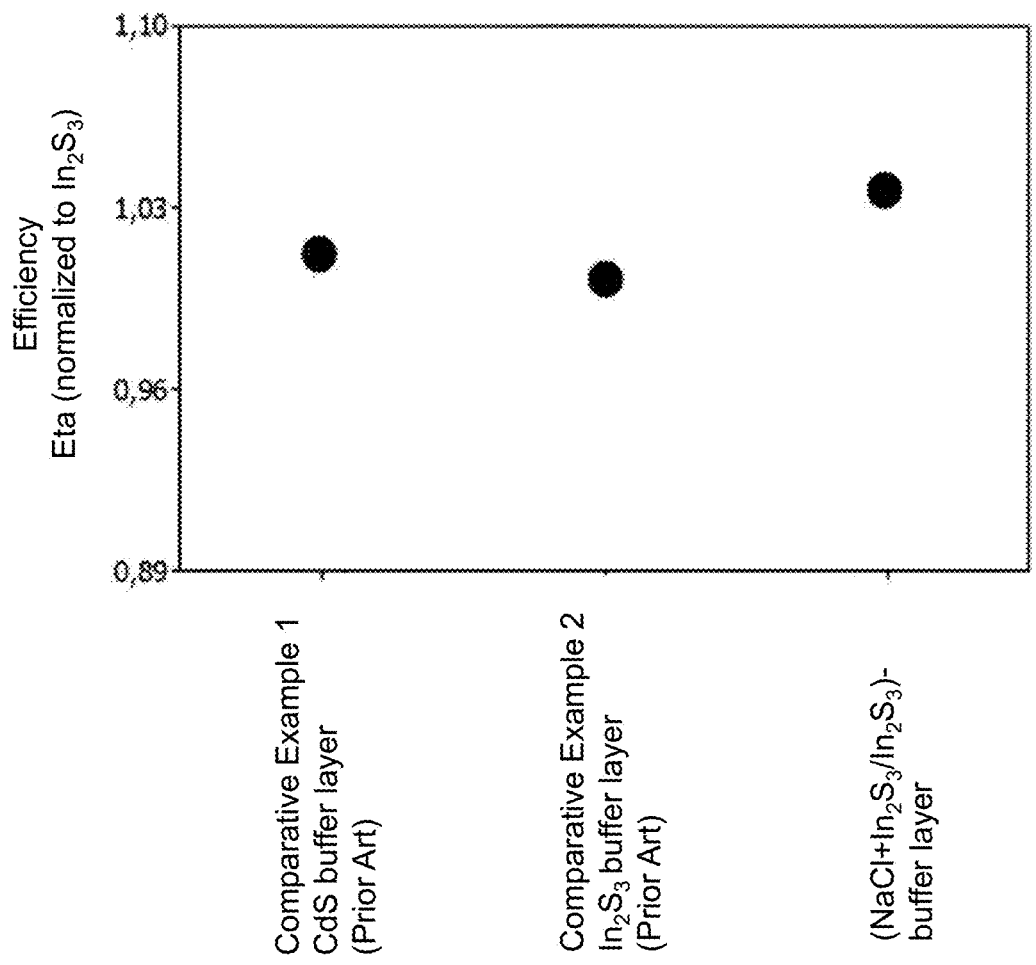
Figure 8:
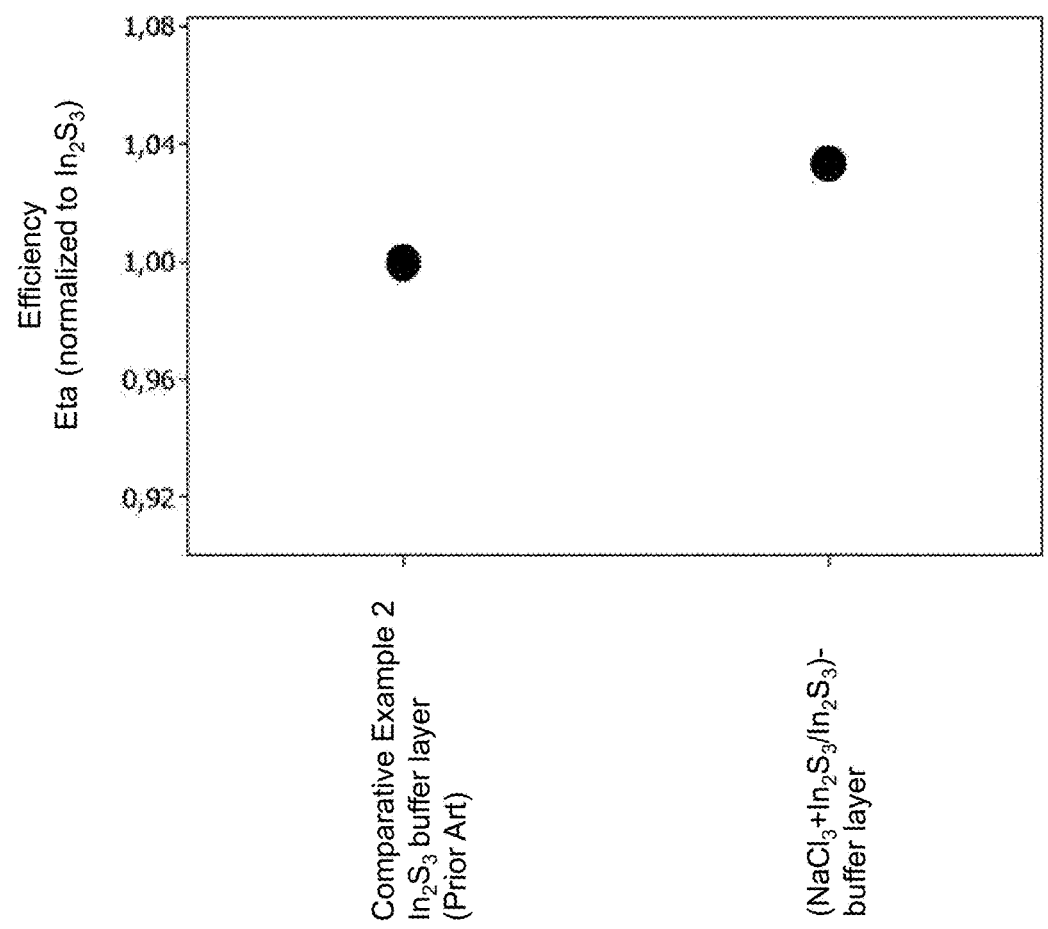
Figure 9:
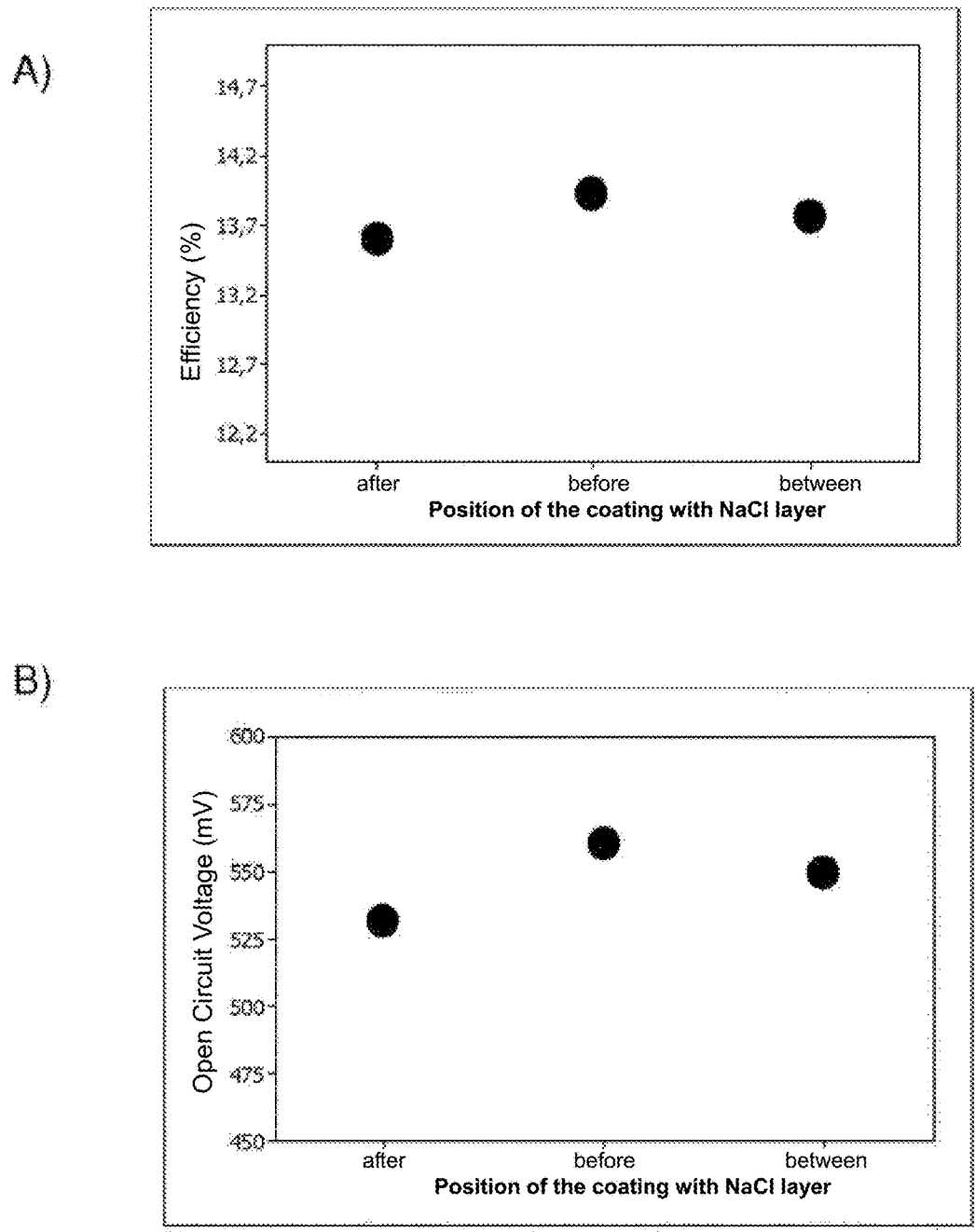
Figure 10:
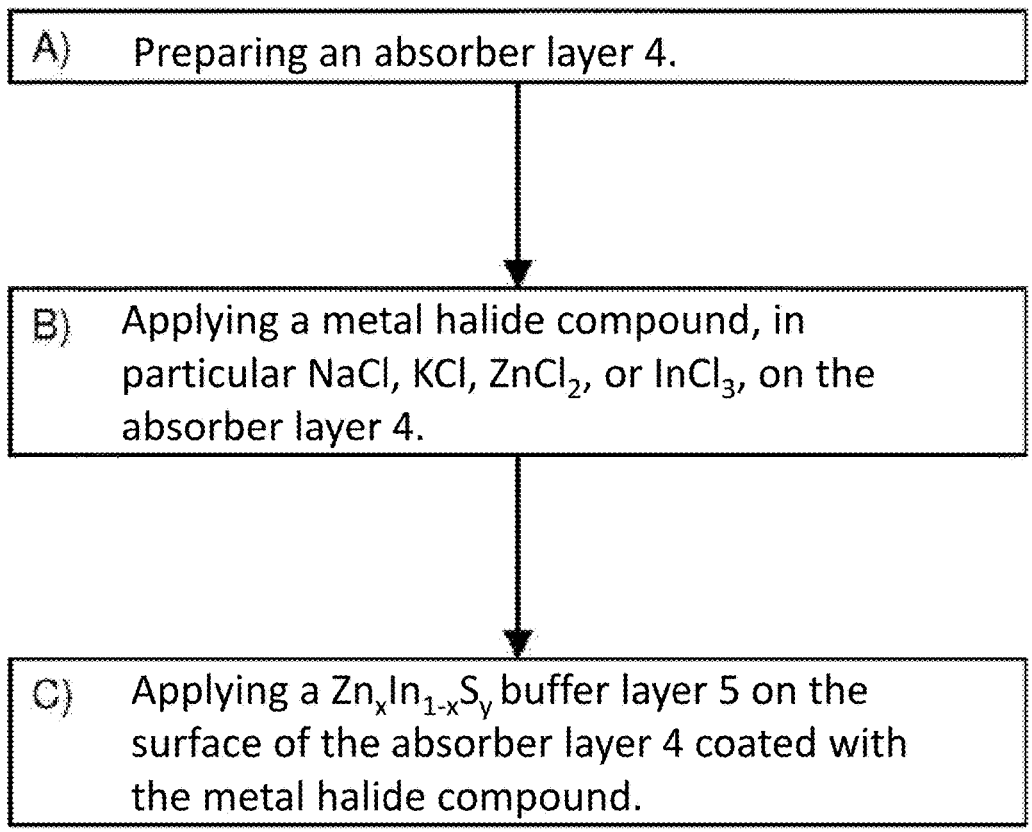
Figure 11:
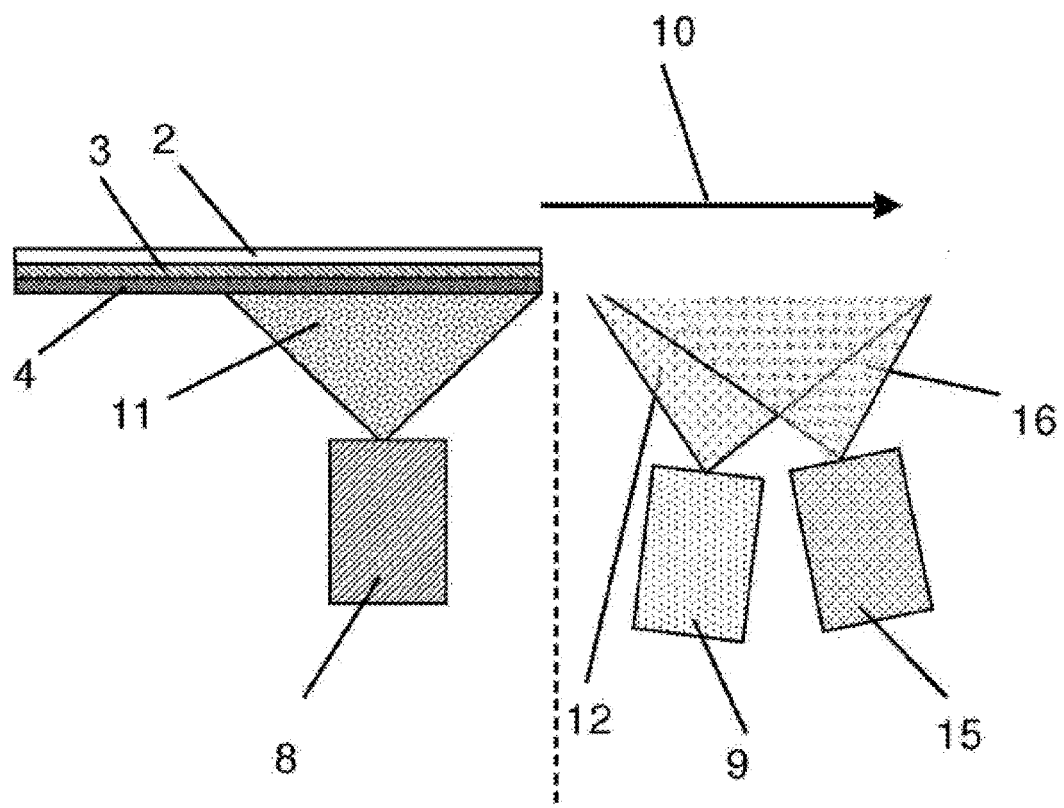
Figure 12:
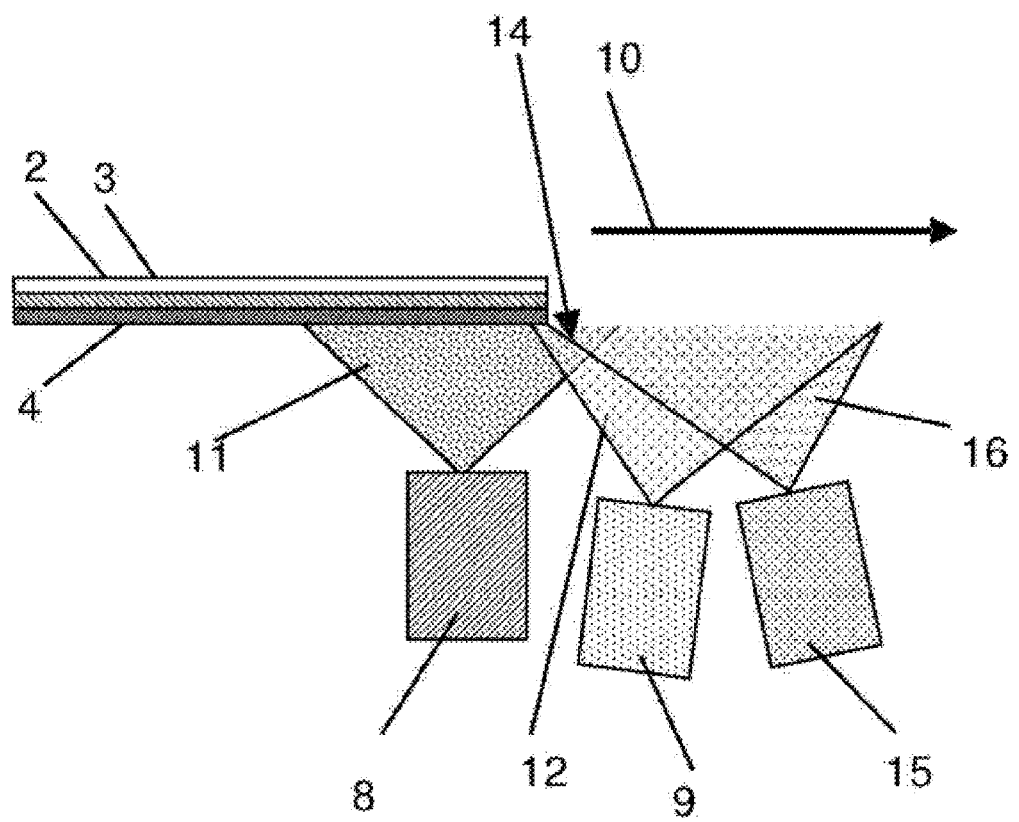

The invention is explained in detail in the following with reference to drawings and an example. The drawings are not completely true to scale. The invention is in no way restricted by the drawings. They depict:

FIG. 1 a schematic cross-sectional view of a solar cell with a layer system according to the invention, FIG. 2 a diagram of the transmission of a $Zn_xIn_{1-x}S_y$ buffer layer on glass for various ratios x, FIG. 3 a diagram of the short-circuit current strength of the solar cell with $Zn_xIn_{1-x}S_y$ buffer layer, FIG. 4 a diagram of the depth profile of chlorine of a layer structure according to the invention with a comparative example, FIG. 5 a diagram of the depth profile of the chlorine, copper, indium, sulfur, and selenium concentration of a layer structure according to the invention, FIG. 6 a diagram of the photoluminescence lifetime of a layer structure according to the invention with a comparative example, FIG. 7 a diagram of the efficiency of a layer structure according to the invention with comparative examples, FIG. 8 a diagram of the efficiency of another layer structure according to the invention with a comparative example, FIG. 9A a diagram of the efficiency of a layer structure according to the invention with a comparative example, FIG. 9B a diagram of the open circuit voltage of an alternative layer structure according to the invention with a comparative example, FIG. 10 an exemplary embodiment of the process steps according to the invention with reference to a flow diagram, FIG. 11 a schematic depiction of an in-line method for producing a buffer layer according to the invention, FIG. 12 a schematic depiction of an alternative in-line method for producing the buffer layer according to the invention.

FIG. 1 depicts purely schematically a preferred exemplary embodiment of a thin-film solar cell 100 according to the invention with a layer system 1 according to the invention in a cross-sectional view. The thin-film solar cell 100 includes a substrate 2 and a rear electrode 3. A layer system 1 according to the invention is arranged on the rear electrode 3. The layer system 1 according to the invention comprises an absorber layer 4 and a buffer layer 5. A second buffer layer 6 and a front electrode 7 are arranged on the layer system 1.

The substrate 2 is made here, for example, of inorganic glass, with it equally possible to use other insulating materials with sufficient stability as well as inert behavior relative to the process steps performed during production of the thin-film solar cell 100, for example, plastics, in particular polymers or metals, in particular metal alloys.

Depending on the layer thickness and the specific material properties, the substrate 2 can be implemented as a rigid plate or flexible film. In the present exemplary embodiment, the layer thickness of the substrate 2 is, for example, from 1 mm to 5 mm.

A rear electrode 3 is arranged on the light-entry side surface of the substrate 2. The rear electrode 3 is made, for example, from an opaque metal. It can, for example, be deposited on the substrate 2 by vapor deposition or magnetic field-assisted cathode sputtering. The rear electrode 3 is made, for example, of molybdenum (Mo), aluminum (Al), copper (Cu), titanium (Ti), or of a multilayer system with such a metal, for example, molybdenum (Mo). The layer thickness of the rear electrode 3 is, in this case, less than 1 μm, preferably in the range from 300 nm to 600 nm, and is, for example, roughly 500 nm. The rear electrode 3 serves as a back-side contact of the solar cell 100. An alkali barrier, made, for example, of $Si_3N_4$, SiON, or SiCN, can be arranged between the substrate 2 and the rear electrode 3. This is not shown in detail in FIG. 1.

A layer system 1 according to the invention is arranged on the rear electrode 3. The layer system 1 includes an absorber layer 4, made, for example, of $Cu(In,Ga)(S,Se)_2$, which is applied directly on the rear electrode 3. The absorber layer 4 has, for example, a thickness of 1.5 μm.

A buffer layer 5 is arranged on the absorber layer 4. The buffer layer 5 includes $Zn_xIn_{1-x}S_y$ with $0.01 \leq x \leq 0.9$, and $1 \leq y \leq 2$ and, for example, $Zn_{0.1}In_{0.9}S_{1.45}$. The layer thickness d of the buffer layer 5 is from 5 nm to 150 nm and, for example, 35 nm. The buffer layer 5 consists of a first layer region 5.1 that adjoins the absorber layer 4 and is connected over its entire area to the absorber layer 4. Moreover, the buffer layer 5 includes a second layer region 5.2, which is arranged on the first layer region 5.1. The first layer region has a thickness $d_1$ that is ≤50% of the layer thickness d of the entire buffer layer 5. The thickness $d_1$ of the first layer region 5.1 is, for example, 10 nm. The first layer region 5.1 contains a halogen mole fraction $A_1$ and the second layer region 5.2, a halogen mole fraction $A_2$. The ratio of the halogen mole fractions $A_1/A_2$ is ≥2 and, for example, 10. For clarification, an exemplary curve of the halogen mole fraction $A_{Halogen}$ is depicted in FIG. 1 as a function of the layer depth s. The data of the halogen mole fraction $A_{Halogen}$ are plotted in atom-%, with the halogen mole fraction also including halogen ions and halogen in compounds.

A second buffer layer 6 can be arranged above the buffer layer 5. The buffer layer 6 includes, for example, non-doped zinc oxide. A front electrode 7 that serves as a front-side contact and is transparent to radiation in the visible spectral range ("window layer") is arranged above the second buffer layer 6. Usually, a doped metal oxide (TCO=transparent conductive oxide), for example, n-conductive, aluminum (Al)-doped zinc oxide (ZnO), boron (B)-doped zinc oxide (ZnO), or gallium (Ga)-doped zinc oxide, is used for the front electrode 7. The layer thickness of the front electrode 7 is, for example, roughly 300 to 1500 nm. For protection against environmental influences, a plastic layer (encapsulation film) made, for example, of polyvinyl butyral (PVB), ethylene vinyl acetate (EVA), or DNP can be applied to the front electrode 7. In addition, a cover plate transparent to sunlight that is made, for example, from extra white glass (front glass) with a low iron content and can have a thickness of, for example, 1 to 4 mm, can be provided.

The described structure of a thin-film solar cell or a thin-film solar module is well known to the person skilled in the art, for example, from commercially available thin-film solar cells or thin-film solar modules and has also already been described in detail in numerous printed documents in the patent literature, for example, DE 19956735 B4.

In the substrate configuration depicted in FIG. 1, the back electrode 3 adjoins the substrate 2. It is understood that the layer structure 1 can also have a superstrate configuration, in which the substrate 2 is transparent and the front electrode 7 is arranged on a surface of the substrate 2 facing away from the light-entry side.

The layer system 1 can serve for production of integrated serially connected thin-film solar cells, with the layer system 1, the front electrode 7, and the rear electrode 3 patterned in a manner known per se by various patterning lines ("P1" for rear electrode, "P2" for front electrode/back electrode contact, and "P3" for separation of the front electrode).

FIG. 2 depicts the transmission of $Zn_xIn_{1-x}S_y$ layers on glass for various x as a function of wavelength. A buffer layer according to the prior art with x=0%, i.e., an $In_2S_3$ layer without a zinc fraction, serves as a comparative example. An increase in transmission over the entire wavelength range from 300 nm to 400 nm for increasing ratios of x is noted. The transmission increase is surprising for these small admixtures of zinc since the band gap changes only slightly for ratios x<10%. In the solar cell, this makes itself felt, as expected, in an increase in the short-circuit current, as shown in FIG. 3.

FIG. 3 shows a diagram of the short-circuit current $J_{SC}$ of solar cells with $Zn_xIn_{1-x}S_y$ buffer layers 5 as a function of x. The short-circuit current $J_{SC}$ is normalized to the short-circuit current of a buffer layer according to the prior art with x=0, i.e., an $In_2S_3$ buffer layer without a zinc fraction. The normalized short-circuit current has a maximum for x=0.15 with $J_{SC}$=1.026.

FIG. 4 depicts the depth profile of chlorine measured by high-resolution time-of-flight secondary ion mass spectrometry (ToF-SIMS) of three differently prepared buffer layers 5 on an absorber layer 4. The chlorine fraction describes the fraction of all chlorine atoms present in the buffer layer 5 regardless of their oxidation state.

The reference measurement was made using a comparative example on an indium sulfide buffer layer according to the prior art without a first layer region 5.1 with halogen enrichment. In the cases Cl-amount 1 and Cl-amount 2, two different amounts of sodium chloride were applied on the absorber layer 4 before the actual buffer deposition 5 made of indium sulfide. The NaCl-area concentration of Cl-amount 1 was roughly $2 \times 10^{14}$ Cl-atoms/cm². The NaCl-area concentration of Cl-amount 2 was roughly $3 \times 10^{14}$ Cl-atoms/cm² and was greater by 50% than with Cl-amount 1.

In FIG. 5, the normalized sputtering time is plotted on the x-axis. The sputtering time corresponds to the sputter depth with the analysis beginning on the surface of the buffer layer 5 facing away from the absorber layer 4. The buffer layer 5 corresponds to the region 0 to 1 on the x-axis and the absorber layer 4 corresponds to the region with values >1. FIG. 4 shows that after somewhat more than half of the buffer layer with a normalized sputtering time of 0.6, a chlorine signal rises in a delta shape and drops again to lower values on obtaining the absorber at a normalized sputtering time of roughly 1. The intensities outside the maximum are attributable in part to diffusion and in part to smearing of the profile due to the relatively rough surface topography of the absorber layer 4. The comparative example also shows smaller amounts of chloride with normalized sputtering times between 0.6 and 0.8, which are attributable to impurities in the starting materials for the deposition. However, the low coating thickness of chloride in the comparative example is insufficient to exert a noteworthy positive effect on efficiency.

FIG. 5 additionally depicts the depth profile of the chlorine enrichment with regard to the interface of absorber layer 4 and buffer layer 5 using Example Cl-amount 1 from FIG. 4 with the other elements copper, indium, sulfur, and selenium. As anticipated, in the region of the indium sulfide buffer layer 5, large fractions of sulfur and indium were measured and in the region of the absorber layer 4, large fractions of copper, selenium, indium, and a smaller fraction of sulfur. It was shown, in particular, that the intensity of the copper signal drops sharply from the interface between absorber layer 4 and buffer layer 5 in the direction of buffer layer 5 and overlaps only a little with the region of high chlorine intensities.

The present invention is based, consequently, on the finding of the inventors that the relatively large halogen atoms or halogen ions localized at the interface reduce, as a diffusion barrier, the inward diffusion of impurities such as copper out of the absorber layer 4 into the buffer layer 5. The halogen atoms or halogen ions localized at the interface in the first layer region 5.1 alter the electronic properties of the buffer layer 5 itself in a positive manner. An inward diffusion of copper into $In_2S_3$ buffer layers is described, for example, in Barreau et al, Solar Energy 83, 363, 2009 and leads, via a reduction of the band gap, to increased optical losses. This occurs primarily through a shift of the valence band maximum, which could, in turn, have a disrupting effect on the formation of the energetically optimum band structure at the p-n-junction. Furthermore, halogen enrichment according to the invention at the interface between the absorber layer and the buffer layer can electronically mask and neutralize defects possibly occurring such that these are no longer active as recombination centers and, thus increase the efficiency of the solar cell overall. In order to detect the reduction of recombination centers, measurements of the photoluminescence lifetime were performed with different buffers on absorber/buffer heterojunctions.

FIG. 6 depicts a diagram of the photoluminescence lifetime for various buffer layers. The lifetime was measured with a photoluminescence measuring station and a 633 nm-laser. Here, the typical penetration depth of the laser light is roughly 70 nm. This means that the photoluminescence of the surface and the region near the surface (in particular the space charge zone at the pn-junction) is measured. The photoluminescence decay time measured corresponds to an effective lifetime that is determined both by the recombination of the charge carriers in the volume and by the recombination at the interface to the buffer layer 5. FIG. 6 presents the typical lifetime of pn-junctions of a buffer layer 5 made of indium sulfide with chloride enrichment and two comparative examples according to the prior art.

Comparative example 1 is a CdS buffer layer according to the prior art. The good lifetime of roughly 40 ns in pn-junctions with CdS buffer layers can be attributed to the very good reduction of interface defects due to the wet chemical processing. Comparative example 2 is a buffer layer according to the prior art made of indium sulfide without halogen enrichment. The pure $In_2S_3$ buffer layer results in a clear reduction of the lifetime to roughly 10 ns, which is attributable to an increased recombination of the charge carriers on the surface and in layers near the surface.

The example shows a $NaCl+In_2S_3/In_2S_3$ buffer layer 5, wherein, before deposition of the buffer layer 5, sodium chloride was applied on the absorber layer 4. This results in the formation of a first layer region 5.1 with a halogen mole fraction $A_1$. The buffer layer 5 presents a significantly increased lifetime of roughly 41 ns. The lifetime in the buffer layer 5 of the example falls within the range of the lifetime of Comparative Example 1, a CdS buffer layer. It can be concluded that despite the dry method of deposition of the buffer layer 5 of the example, a significant reduction of interface defects is achieved. The introduction of the halogen-rich first layer region 5.1 thus actually results in an improvement of the electronic properties of the absorber-buffer interface, in comparison to an indium sulfide buffer layer without halogen enrichment.

The efficiency of buffer layers 5 with halide enrichment at the interface to the absorber layer 4 is improved relative to pure indium sulfide buffer layers over a wide range relative to the halogen mole fraction $A_1$ in the first layer region 5.1.

FIG. 7 depicts the efficiency of solar cells 100 with a buffer layer 5 with a NaCl pre-coating and two comparative examples according to the prior art. In Comparative Example 1, the buffer layer is a wet-chemically deposited CdS layer. In Comparative Example 2, the buffer layer is an indium sulfide layer without halogen enrichment deposited from the gas phase. The buffer layer 5 was produced by a NaCl pre-coating by pre-deposition of sodium chloride onto the absorber layer 4. Then, indium sulfide was deposited from the gas phase onto the NaCl pre-coating. As can be discerned from FIG. 7, the highest efficiencies, averaging 1.04 normalized to the efficiency of Comparative Example 2, i.e., an $In_2S_3$ buffer layer according to the prior art without halogen enrichment, are obtained with the buffer layer 5 with NaCl pre-coating.

FIG. 8 presents the measurement of the efficiency for an $In_2S_3$ buffer layer according to the prior art without $InCl_3$ pre-coating compared to the efficiency of an alternative buffer layer 5 with halogen enrichment through pre-coating with indium chloride (InCl3). $InCl_3$ pre-coating also results in halogen enrichment in the first layer region 5.1 at the interface to the absorber layer 4, which dopes the interface and, moreover, reduces the surface defects. FIG. 8 clearly shows that halogen enrichment of the buffer layer 5 according to the invention increases the efficiency of solar cells 100. The increase in efficiency with $InCl_3$ pre-coating is, in this case, roughly 4% and is in the same order of magnitude as with a NaCl pre-coating in FIG. 7.

Copper, oxygen, and selenium can also be found in the buffer layer 5 in addition to the elements indium, sulfur, and chlorine. Indium sulfide has a relatively open lattice structure into which other elements such as sodium and copper can be incorporated quite well. The deposition of the buffer layer 5 can occur at relatively high temperatures, in particular at temperatures from room temperature to roughly 200° C. The subsequent transparent front electrode 7 is also deposited preferably at temperatures up to 200° C. At these temperatures, sodium, copper, and selenium can diffuse out of the absorber layer 4 or the front electrode 7 into the buffer layer 5. In this case, these elements can also be enriched at the interface through pre-coating with a metal-halogen compound in addition to halogen. Depending on the selection of the metal-halogen compound, the accompanying metal in the first layer region 5.1 of the buffer layer 5 will also be enriched. Due to the hygroscopic properties of the starting materials, enrichment by water from the ambient air is also conceivable.

FIG. 9 A depicts the efficiency and FIG. 9 B the open circuit voltage as a function of the distribution of NaCl enrichment in the buffer layer 5. Solar cells 100 with layer systems 1, wherein sodium chloride was applied after deposition of the buffer layer ("after"), before deposition of the buffer layer ("before"), and within the buffer layer 5 ("between"), are compared. The solar cell 100 corresponds to the arrangement as it was described under FIG. 1. The layer system 1 "before", wherein sodium chloride was deposited before the deposition of the buffer layer, presents the highest efficiency, averaging 14%, and the highest average open circuit voltage of 560 mV. FIG. 9 A and FIG. 9 B document the particular effectiveness of halogen enrichment in a first layer region 5.1 at the interface to the absorber layer 4 through pre-coating of the absorber layer 4 with sodium chloride ("before") in contrast to positioning in the middle of the buffer layer 5 ("between") or post-coating ("after") at the interface to the second buffer layer 6.

The essential idea for this invention is to combine the gain in current due to a fraction of zinc, as was shown in FIG. 3, with an increase of the open circuit voltage due to halogen enrichment of the buffer layer 5 at the interface to the absorber layer 4, as was shown in FIG. 9 B. Particularly advantageous layer systems 1 were successfully obtained in this manner.

Experiments of the inventors demonstrated that doping of the entire buffer layer 5 with sodium and, in particular, with sodium chloride also increases the short-circuit current strength of a solar cell 100. This can be explained by a widening of the band gap in the buffer layer 5 by sodium doping. Since sodium is relatively mobile, it is not possible to rule out outward diffusion of sodium from the buffer layer into the absorber layer or the front electrode with the addition of sodium to an $In_2S_3$ buffer layer according to the prior art. However, the increase of sodium in the absorber layer can lead to an increase in the absorber conductivity, to the development of short circuits, and to the reduction in the width of the depletion zones. In the present invention, the widening of the band gap is obtained through the addition of zinc into the buffer layer 5 and separated from the positive effect of halogen enrichment in a first buffer layer 5.1 at the interface to the absorber layer 4. As experiments of the inventors showed, zinc is stably bound in the buffer layer 5. In this manner, particularly advantageous solar cells with particularly high efficiencies and particularly high stability can be obtained.

FIG. 10 depicts a flow diagram of a method according to the invention. In a first step, an absorber layer 4 is prepared, for example, from a $Cu(In,Ga)(S,Se)_2$ semiconductor material. In a second step, the buffer layer 5 of sodium and chlorine, for example, of sodium chloride, and zinc indium sulfide is deposited. The zinc indium sulfide is deposited, for example, by simultaneous deposition of zinc sulfide and indium sulfide. The ratio of the individual components in the buffer layer 5 is regulated, for example, by control of the deposition rate, for example, by an aperture or by temperature control.

In further process steps, a second buffer layer 6 and a front electrode 7 can be deposited on the buffer layer 5. In addition, connecting and contacting of the layer structure 1 to a thin-film solar cell 100 or to a solar module can take place.

FIG. 11 presents a schematic depiction of an in-line method for producing a buffer layer 5 according to the invention. In an in-line method, the substrate 2 with rear electrode 3 and absorber layer 4 is conveyed past the steam beam 11 of a halogen-containing evaporator source and, for example, past a sodium chloride source 8. The transport direction is indicated by an arrow with the reference character 10.

The amount of sodium chloride deposited is adjusted, for example, by opening and closing an aperture such that an NaCl amount of more than $1\times10^{13}$ atoms/cm$^2$ and less than $1\times10^{17}$ atoms/cm$^2$ is deposited on the surface.

Then, the absorber layer 4 pre-coated with sodium chloride is conveyed past at least one indium sulfide source 9 and one zinc sulfide source 15. This occurs preferably without vacuum interruption. The layer thickness d of the buffer layer 5, the ratio x/(1−x) of zinc to indium, and the halogen enrichment profile over the buffer layer 5 can be controlled by the deposition rates, transport speeds, and number of halogen sources 8, of indium sulfide sources 9, and of zinc sulfide sources 15.

The source for the deposition of the metal-halogen compound, of indium sulfide or zinc sulfide is, for example, an effusion cell, a boat or crucible of a thermal evaporator, of a resistance heater, of an electron beam evaporator, or of a linear evaporator.

FIG. 12 presents a schematic depiction of an alternative in-line method for producing a buffer layer 5 according to the invention. The indium sulfide source 9 and the zinc sulfide source 15 are arranged such that their steam beams 12,16 overlap virtually completely. The sodium chloride source 8 is arranged such that the steam beam 11 of the sodium chloride sources 8 and the steam beams 12,16 of the indium sulfide source 9 and the zinc sulfide source 15 overlap partially in an overlap region 14. The sodium chloride source 8, the indium sulfide source 9, and the zinc sulfide source 9 [sic] are, for example, effusion cells out of which sodium chloride or indium sulfide is thermally evaporated. Alternatively, any other form of generation of steam beams 11,12,16 is suitable for the deposition of the buffer layer 5 so long as the ratio of the mole fractions of chlorine, zinc, indium, and sulfur can be controlled.

In this manner, for example, a gradient with a continuous decrease in halogen concentration can be formed in the buffer layer 5. As experiments of the inventors have demonstrated, such a gradient is particularly advantageous for the properties of the solar cell 100 according to the invention.

The introduction of chlorine from sodium chloride, indium chloride, or zinc chloride into the indium sulfide buffer layer 5 has multiple special advantages. Sodium chloride is non-toxic and economical and can, as already mentioned, be readily applied using thermal methods. During thermal deposition, sodium chloride evaporates as NaCl molecules and does not dissociate to sodium and chlorine. This has the particular advantage that during evaporation, no toxic and corrosive chlorine develops.

The introduction of chlorine from sodium chloride offers additional advantages from a production technology standpoint. Only one substance has to be evaporated, greatly simplifying the process compared to possible mixtures of substances such as $NaCl/ZnS/In_2S_3$. The vapor pressure curve of NaCl is known, for example, from C. T. Ewing, K. H. Stern, "Equilibrium Vaporization Rates and Vapor Pressures of Solid and Liquid Sodium Chloride, Potassium Chloride, Potassium Bromide, Cesium Iodide, and Lithium Fluoride", J. Phys. Chem., 1974, 78, 20, 1998-2005, and a thermal vapor deposition process can be readily controlled by temperature. Moreover, an arrangement for vapor deposition of sodium chloride can be readily integrated into existing thermal indium sulfide coating equipment.

Moreover, halide enrichment can be controlled and measured simply. Thus, for process control during the vapor deposition, a quartz resonator can be used for direct measurement of the rate. An optical control of the sodium amount and, consequently, the chloride amount can be used by means of emission spectroscopy. Alternatively, sodium chloride can be deposited on silicon and this can be investigated with x-ray fluorescence analysis (XRF), with an ellipsometer or a photospectrometer in-line or after the process. The introduction of chlorine from indium chloride or zinc chloride into the zinc indium sulfide buffer layer 5 has the advantage that indium and zinc are components of the buffer layer 5 and, consequently, no further function-impairing foreign metals get into the buffer layer 5.

From the above assertions, it has become clear that by means of the present invention the disadvantages of previously used CdS buffer layers or the alternative buffer layers were overcome in thin-film solar cells, with the efficiency and the stability of the solar cells produced therewith also very good or better. At the same time, the production method is economical, effective, and environmentally safe. This was unexpected and surprising for the person skilled in the art.

REFERENCE CHARACTERS

1 layer system
2 substrate
3 rear electrode
4 absorber layer
5 buffer layer
5.1 first layer region
5.2 second layer region
6 second buffer layer
7 front electrode
8 sodium chloride source
9 indium sulfide source
10 transport direction
11 sodium chloride steam beam
12 indium sulfide steam beam
14 overlapping region
15 zinc sulfide source
16 zinc sulfide steam beam
100 thin-film solar cell, solar cell
d layer thickness of the buffer layer 5
$d_1$ layer thickness of the first layer region 5.1
s layer depth
$A_1$ halogen mole fraction in the first layer region 5.1
$A_2$ halogen mole fraction in the second layer region 5.2
$A_{Halogen}$ halogen mole fraction

The invention claimed is:

1. Layer system for thin-film solar cells, comprising:
an absorber layer, which includes a chalcogenide compound semiconductor, and
a buffer layer, which is arranged on the absorber layer and includes halogen-enriched $Zn_xIn_{1-x}S_y$ with $0.01 \leq x \leq 0.9$ and $1 \leq y \leq 2$,
wherein the buffer layer consists of a first layer region adjoining the absorber layer with a halogen mole fraction $A_1$ and a second layer region adjoining the first layer region with a halogen mole fraction $A_2$ and a ratio $A_1/A_2$ is $\geq 2$ and a layer thickness of the first layer region is $\leq 20\%$ of a layer thickness of the buffer layer.

2. Layer system according to claim 1, wherein the ratio $A_1/A_2$ is from 2 to 1000.

3. Layer system according to claim 1, wherein an amount of the halogen in the first layer region amounts to an area concentration of $1 \cdot 10^{13}$ atoms/cm$^2$ to $1 \cdot 10^{17}$ atoms/cm$^2$.

4. Layer system according to claim 1, wherein y is from $x+(1-x)*1.3$ to $x+(1-x)*1.5$.

5. Layer system according to claim 1, wherein the halogen mole fraction in the buffer layer has a gradient that decreases from a surface facing the absorber layer to an interior of the buffer layer.

6. Layer system according to claim 1, wherein the layer thickness of the buffer layer is from 5 nm to 150 nm.

7. Layer system according to claim 1, wherein the halogen is chlorine, bromine, or iodine.

8. Layer system according to claim 1, wherein the chalcogenide compound semiconductor includes $Cu(In,Ga,Al)(S,Se)_2$.

9. Thin-film solar cell, comprising:
a substrate,
a rear electrode that is arranged on the substrate,
a layer system according to claim 1 that is arranged on the rear electrode, and
a front electrode that is arranged on the layer system.

10. Method for producing a layer system for thin-film solar cells, comprising:
a) preparing an absorber layer, and
b) arranging a buffer layer, which contains halogen-enriched $Zn_xIn_{1-x}S_y$ with $0.01 \leq x \leq 0.9$ and $1 \leq y \leq 2$ on the absorber layer,
wherein the buffer layer consists of a first layer region adjoining the absorber layer with a halogen mole fraction $A_1$ and a second layer region adjoining the first layer region with a halogen mole fraction $A_2$ and a ratio $A_1/A_2$ is $\geq 2$, and a layer thickness of the first layer region is $\leq 20\%$ of a layer thickness of the buffer layer.

11. Method according to claim 10, comprising:
in the step b), applying a metal-halide compound on the absorber layer and applying zinc indium sulfide on the metal-halide compound.

12. Method according to claim 10, comprising:
in the step b), applying a metal-halide compound and zinc indium sulfide on the absorber layer.

13. Method according to claim 12, comprising:
conveying the absorber layer past at least one steam beam of the metal-halide compound and at least one steam beam of indium sulfide and zinc sulfide.

14. Method according to claim 12, comprising:
applying the metal-halide compound with chlorine, bromine, and/or iodine as halogen and sodium, potassium, aluminum, gallium, indium, zinc, cadmium, and/or mercury as metal.

15. Layer system according to claim 1, wherein the ratio $A_1/A_2$ is from 10 to 100.

16. Layer system according to claim 1, wherein the amount of the halogen in the first layer region amounts to an area concentration of $2 \cdot 10^{14}$ atoms/cm$^2$ to $2 \cdot 10^{16}$ atoms/cm$^2$.

17. Layer system according to claim 1, wherein the layer thickness of the buffer layer is from 15 nm to 50 nm.

18. Layer system according to claim 1, wherein the chalcogenide compound semiconductor includes $CuInSe_2$, $CuInS_2$, $Cu(In,Ga)Se_2$, $Cu(In,Ga)(S,Se)_2$, or $Cu_2ZnSn(S,Se)_4$.

* * * * *